(12) United States Patent
Dalal et al.

(10) Patent No.: US 6,661,836 B1
(45) Date of Patent: Dec. 9, 2003

(54) MEASURING JITTER OF HIGH-SPEED DATA CHANNELS

(75) Inventors: Wajih Dalal, Palo Alto, CA (US); Daniel A. Rosenthal, Saratoga, CA (US)

(73) Assignee: NPTest, LLP, San Jose, CA (US)

( * ) Notice: Subject to any disclaimer, the term of this patent is extended or adjusted under 35 U.S.C. 154(b) by 0 days.

(21) Appl. No.: 09/419,317

(22) Filed: Oct. 17, 1999

Related U.S. Application Data

(60) Provisional application No. 60/105,100, filed on Oct. 21, 1998.

(51) Int. Cl.[7] .............................................. H04B 17/00
(52) U.S. Cl. ...................................................... 375/226
(58) Field of Search ................................ 375/226, 224, 375/228, 227; 324/76.15, 76.42; 370/516; 341/165

(56) References Cited

U.S. PATENT DOCUMENTS 5,122,800 A  *  6/1992  Philipp ........................ 341/122
5,589,763 A  * 12/1996  Burns ....................... 324/76.15

OTHER PUBLICATIONS

Jitter Working Group Technical Report Rev. 1.0, Draft E, May 27, 1997, pp. 26–29.
B. Kaulp, *Testing and Characterizing Jitter in 100BASE–TX and 155.52 Mb/s ATM Devices with a Gsamples/s AWG in an ATE System*, International Test Conference, 1996, Paper 5.1, pp. 104–111.
X3 Technical Report—Fibre Channel—Methodologies for Jitter Specification, ANSI TRx3.xxx–199x Revision 1.0 Draft E, May 27, 1997.
Test List Option Users Guide, Wavecrest Corporation, Edina, Minnesota, Mar. 1997, 45 pages.
M.K. Williams, *Accuracy in M1/720 Time Interval Measurement Systems*, ASA Tech Brief 95–38, ASA Doc #96–1, Amherst Systems Associates, Inc., Amherst, MA, 1997, 7 pages.
Hewlett Packard Multimedia Symposium, Sep. 4, 1996, 5 pages.
W. Dalal et al., *Measuring Jitter of High Speed Data Channels Using Undersampling Techniques*, International Test Conference, Paper 32.3, IEEE 1998, pp. 814–818.

* cited by examiner

*Primary Examiner*—Khai Tran
(74) *Attorney, Agent, or Firm*—Bruce D. Riter

(57) ABSTRACT

A jitter measurement technique utilizing a high-bandwidth undersampling voltage measurement instrument is presented. A trigger is derived from the a signal having a repetitive signal pattern. The signal is compared with a threshold at a plurality of times relative to the trigger during multiple repetitions of the signal pattern to produce measurement samples indicative of signal level relative to the threshold. The measurement samples are used to determine the probability of signal edge states as a function of time for the multiple repetitions. The probability of signal edge states are used to determine an edge probability density as a function of time. A histogram of signal state transition times can be prepared from the edge probability density. Mean deviation of edge transitions of the signal can be estimates, and standard deviation of edge transitions of the signal can be estimated to give the root-mean-square (rms) jitter of the signal.

20 Claims, 8 Drawing Sheets

MEASURING JITTER OF HIGH-SPEED DATA CHANNELS

Priority under 35 USC §119(e) of U.S. provisional application No. 60/105,100, filed Oct. 21, 1998 is hereby claimed.

BACKGROUND OF THE INVENTION

1. Field of the Invention

The invention relates to measurement of high-speed data channels, particularly measurement of jitter in clock signals using self-triggered undersampling techniques.

2. The Prior Art

In serial data communication standards such as Ethernet and ATM (speed range from 100 Mbps to 622 Mbps) or the higher speed new communication standards such as Fibre Channel, Firewire (S800 and S1600) and GigaBit Ethernet, the data and clock are embedded within the signal codes. Because of these characteristics the receiver must have special clock recovery circuitry (implemented with a phase-locked loop (PLL)), that would extract the data and clock from the "analog" symbols received through the media. These clock recovery circuits are sensitive to input jitter (time distortion) and level distortion. To guarantee proper data reception in any network the transmitter must meet a certain budget of transmitted jitter. Typical measurements in ATE systems use a GPIB instrument which can be slow, or a built in time measurement unit which can have limited bandwidth relative to the Gigabit data speed ranges.

Jitter in High Speed Data Communication Channels

Jitter is a critical parameter in high speed data communication channels. Jitter compliance is required for the transmitter and receiver in a communication system. The transmitter must meet a certain error budget of allowable jitter to be introduced into the network. The receiver must tolerate a certain amount of jitter in the received signal. See, for example, FIG. 1A which shows an example of a proposed jitter tolerance specification from JITTER WORKING GROUP TECHNICAL REPORT REV. 1.0, DRAFT E, May 27, 1997. In high speed communications the clock and data are embedded into the same physical signal. Thus, clock recovery circuitry is required on the receiver. This clock recovery circuitry employs phase-locked loops (PLL) that are sensitive to input jitter. Excessive jitter could cause errors in the data recovery impacting the bit error rate (BER) and the integrity of the overall network. Test techniques have been described for characterizing the jitter tolerance of the receivers. B. KULP, *Testing and Characterizing Jitter in 100BASE-TX and 155.52 Mb/s ATM Devices with a Gsamples/s AWG in an ATE System*, International Test Conference, 1996, Paper 5.1, pp. 104–111. The subject of this paper is the characterization of the transmitting device jitter.

Similar serial data techniques and parameters also apply to hard disk drive read/write channels. In this case the serial data and embedded clock information is stored on and retrieved from a magnetic medium rather than being transmitted over cable; however, the sensitivity to jitter is similar.

Jitter sources could come from power supply noise, thermal noise from the PLL components and limited bandwidth of the transmitter (affecting mostly the Data Dependent Jitter-DDJ). The media through which the data is being transmitted could also add jitter. All of the above should be compensated for at the receiver side.

High speed communication standards specify the jitter budget allowed for the transmitter and its components, e.g., draft proposed X3 Technical Report—Fibre Channel—Methodologies for Jitter Specification, ANSI TRx3.xxx-199x Revision 1.0 Draft E, May 27, 1997. These jitter components consist of: DDJ—Data Dependent Jitter, RJ—Random Jitter, and DCD—Duty Cycle Distortion. Though the classification of jitter is critical for characterization and design validation, in the production environment the focus is on overall jitter.

Spectrum Analyzer Measurement

An analog spectrum analyzer can be used to measure the jitter of a signal in the frequency domain in terms of the phase noise. For this measurement the jitter is modeled as phase modulation. For example, a sine wave signal is represented as a perfect sine wave with amplitude and phase modulation:

$$v(t)=a(t)\sin(\omega+\theta(t))$$

With a spectrum analyzer one can measure the power of the signal as a function of frequency with wide dynamic range, however one cannot distinguish between the amplitude and phase modulation components. A common assumption made when using a spectrum analyzer to measure jitter is that the amplitude modulation component of the signal is negligible. This assumption may be valid for signals internal to a pure digital system where undistorted square waves or pulses are the norm. This assumption is typically not true for a serial communication or data channel. Isolating the noise from the actual signal frequency components and translating that into jitter is non-trivial.

Real-time Tinie-interval-analyzer Measurements

This technique measures the time interval between a reference voltage (Vref) crossing of the transmitted signal. There is no need for an abstract model of the signal when using this technique because the time intervals are measured directly. The real-time time-interval analyzer gives complete knowledge of the nature of the jitter and the components of the jitter. With this measurement technique the position and time of every edge is measured, thus allowing statistical space and frequency-based models of the signal, as well as absolute peak-to-peak measurements. The clear advantages of this technique are the facts that there are no skipped edges and the measurement acquisition time is limited only by the signal itself In practice, instrumentation that has the necessary acquisition rate and resolution to test gigabit data rates (as seen with Firewire and Fibre Channel) does not exist.

Repetitive Start/Stop Time Measurements

This is a common technique that gives high resolution and accuracy using a direct time measurement. Time measurements are made by starting a counter on the first occurrence of an edge, and stopping the counter on the next edge. Enhancements to this technique include skipping multiple edges for cumulative measurements, comparing two different signals, and time interpolation for achieving resolution greater than the counter clock period. Re-triggering of the time interval measurement normally requires a significant dead time, particularly when time interpolation is used. After collecting many of these time interval measurements, post processing is applied to extract statistical parameters and jitter components. This technique has been used to good effect in automatic test equipment (ATE) to measure jitter of low frequency clocks (<100 MHz) or in some bench top instrument implementations that include special software features for jitter components characterization, such as the DTS-2075 instrument from Wavecrest Corporation. See TEST LIST OPTION USERS GUIDE, Wavecrest Corporation, Edina, Minn., March 1997, 45 pages.

Oscilloscope Based Histogram Measurements

This method is based on time-base analysis of the repetition of an edge in reference to a trigger (self trigger, or external trigger). The actual analog values of the signal are measured (either in real time, or undersampled equivalent time), and an overlay history of the signal is accumulated and displayed. High and low voltage thresholds, multiple time interval windows, and the number of samples to be acquired are defined. A histogram is produced according to the number of samples that fall into each of the time/voltage windows, as indicated in FIG. 1B. Enhancements to this technique had been performed by post-processing the real-time captured analog waveform with advanced filtering to achieve fine accuracy and cycle-to-cycle jitter contributions, M. K. WILLIAMS, Accuracy in M1/720 *Time Interval Measurement Systems*, ASA Tech Brief 95-38, ASA Doc #96-1, Amherst Systems Associates, Inc., Amherst, Mass., 1997, 7 pages.

Functional Test VLSI ATE Method

This method is based on developing a histogram of binary comparisons as an Automatic Test Equipment (ATE) system strobe signal is swept across a Device Under Test (DUT) signal transition in time. The DUT signal is strobed repeatedly and the pass/fail results are stored in computer memory and later used to create a histogram that represents the probability density function of the DUT edge placement. This method is limited in that only signals that are synchronous with the ATE system clock can be measured. This limitation renders this method of limited usefulness for testing high speed serial data communication signals, because the DUT signals are often derived from clocks that are independent from the ATE system.

SUMMARY OF THE INVENTION

A new jitter measurement technique utilizing a high-bandwidth undersampling voltage measurement instrument is presented. This type of undersampling instrument is common in mixed-signal ATE. Advantages of this new technique over other traditional jitter measurement techniques are: bandwidth, ease of use, and throughput.

A method consistent with the invention for measuring jitter of a signal having a repetitive signal pattern comprises: deriving a trigger from the signal; comparing the signal with a threshold at a plurality of times relative to the trigger during multiple repetitions of the signal pattern to produce measurement samples indicative of signal level relative to the threshold; determining from the measurement samples the probability of signal edge states as a function of time for the multiple repetitions; and determining from the probability of signal edge states an edge probability density as a function of time for the multiple repetitions.

Comparing the signal with a threshold can comprise comparing level of the signal with a voltage threshold and producing a measurement sample for each comparison. The measurement sample can be a binary comparison result. Comparing the signal with a threshold can comprise connecting a high-speed comparator to a source of the signal without compensating for signal path, impedance matching and/or device-under-test (DUT) loading effects. Comparing the signal with a threshold at a plurality of times during multiple repetitions of the signal pattern can be performed relative to a trigger signal generated from a system clock (T0) in an automatic-test-equipment (ATE) tester or by a signal which is synchronous to the signal having a repetitive signal pattern.

Comparing the signal with a threshold at a plurality of times during multiple repetitions of the signal pattern can be performed with incremental time shifts from measurement sample to measurement sample such that resolution of the incremental time shift is the effective sampling rate. Comparing the signal with a threshold at a plurality of times during multiple repetitions of the signal pattern can be performed such that time shift from measurement sample to measurement sample is linearly incremental or is not linearly incremental. Comparing the signal with a threshold at a plurality of times during multiple repetitions of the signal pattern can be performed such that density of the measurement samples is constant with respect to time or is not constant with respect to time.

Determining the probability of signal edge states can comprise estimating probability of signal edge states in accordance with the relationship $P\{x(t)>V_{ref}\}=1/K\Sigma M_j(t)$, where $P\{x(t)>V_{ref}\}$ is the probability over time t that the level of the signal x is greater than a threshold voltage $V_{ref}$, j is the measurement sample number, K is the number of measurement samples per time step, and $M_j$ is a binary measurement sample result. Determining edge probability density as a function of time can comprise differentiating the probability of signal edge states. A method consistent with the invention can further comprise preparing from the edge probability density as a function of time a histogram of signal state transition times. A method consistent with the invention can further comprise estimating mean deviation $\mu$ of edge transitions of the signal. A method consistent with the invention can further comprise estimating standard deviation $\sigma$ of edge transitions of the signal to give the root-mean-square (rms) jitter of the signal.

Apparatus consistent with the invention for measuring jitter of a signal having a repetitive signal pattern comprises: a sample probe (740) for deriving a trigger from the signal; a sampler (715) having a timing generator (745) and sample probe (735) for comparing the signal with a threshold at a plurality of times relative to the trigger during multiple repetitions of the signal pattern to produce measurement samples indicative of signal level relative to the threshold; and a processor (760) for determining from the measurement samples the probability of signal edge states as a function of time for the multiple repetitions, and for determining from the probability of signal edge states an edge probability density as a function of time for the multiple repetitions.

These and other features consistent with the invention will become apparent to those of skill in the art from the illustrations and description which follow.

DETAILED DESCRIPTION

An undersampling jitter measurement technique consistent with the invention has the advantage of being able to realize very high bandwidth with minimal device output loading. The technique produces a statistical description of the jitter in terms of delay and standard deviation. In this technique, the signal is compared repetitively to a voltage threshold across a defined time interval. The results of the comparison are stored and then analyzed.

Figure 1A:
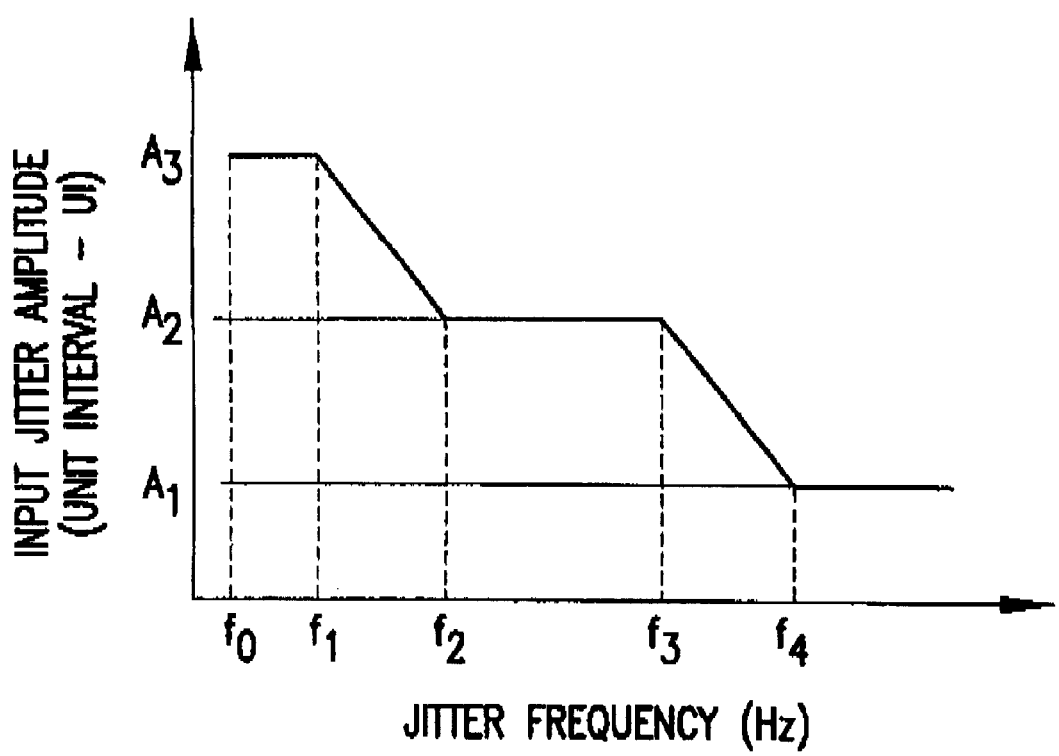
FIG. 1A shows an example of a prior-art proposed jitter tolerance specification.
Figure 1B:
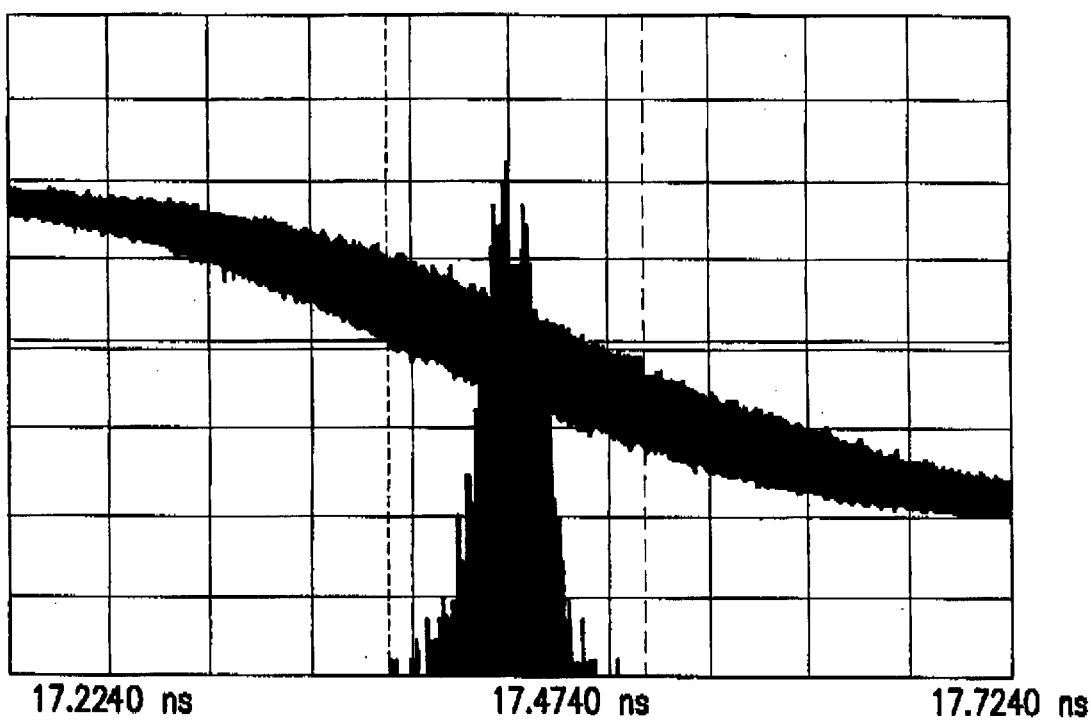
FIG. 1B shows a histogram of a repetitive signal edge made in reference to a trigger using a prior-art oscilloscope method.
Figure 2:
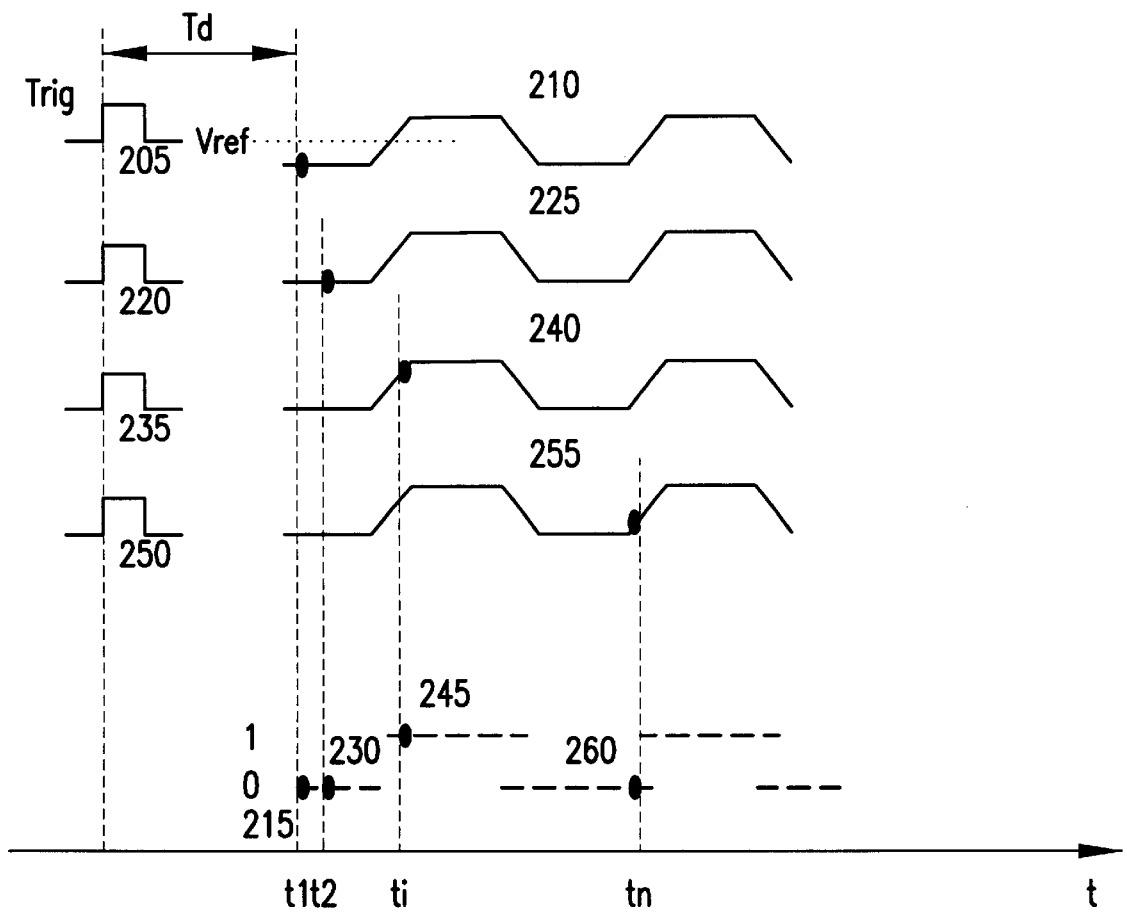
FIG. 2 illustrates a method of sampling a repetitive signal in accordance with the invention.

FIG. 2 illustrates an example of sampling a repetitive signal in accordance with the invention. A set of comparison measurements, $m_i$, are made at time points $t_i$(relative to the trigger point). These measurements are made by sampling the repetitive waveform with incremental time shifts. The incremental time shift resolution becomes the effective sample rate. The sample's location in time does not necessarily have to be linearly incremental. Each time location $t_i$ can be sampled multiple times to build a statistical picture.

As shown in FIG. 2, a trigger pulse "Trig" occurring at a time interval Td before the beginning of the signal pattern is used as a reference. The trigger pulse can be derived from the repetitive signal as described below with reference to FIG. 7. A first trigger pulse 205 precedes a first signal pattern occurrence 210. Signal pattern occurrence 210 is compared with a threshold reference voltage Vref at a time t1. As shown at 215, the binary result of the comparison is "0" because the signal is below Vref at time t1. A second trigger pulse 220 precedes a second signal pattern occurrence 225. Signal pattern occurrence 225 is compared with threshold reference voltage Vref at time t2. As shown at 230, the binary result of the comparison is "0" ("low" logic state) because the signal is below Vref at time t1. An i-th trigger pulse 235 precedes an i-th signal pattern occurrence 240. Signal pattern occurrence 240 is compared with threshold reference voltage Vref at time ti. As shown at 245, the binary result of the comparison is "1" ("high" logic state) because the signal is above Vref at time ti. The process is repeated so that the signal pattern is sampled at a plurality of times during many repetitions of the signal pattern. An n-th trigger pulse 250 precedes an n-th signal pattern occurrence 255. Signal pattern occurrence 255 is compared with threshold reference voltage Vref at time tn. As shown at 260, the binary result of the n-th comparison is "0" because the signal is below Vref at time tn. Undersampling is shown in FIG. 2 as once per repetition of the signal pattern, though undersampling can be more or less frequent as desired.

Figure 3:
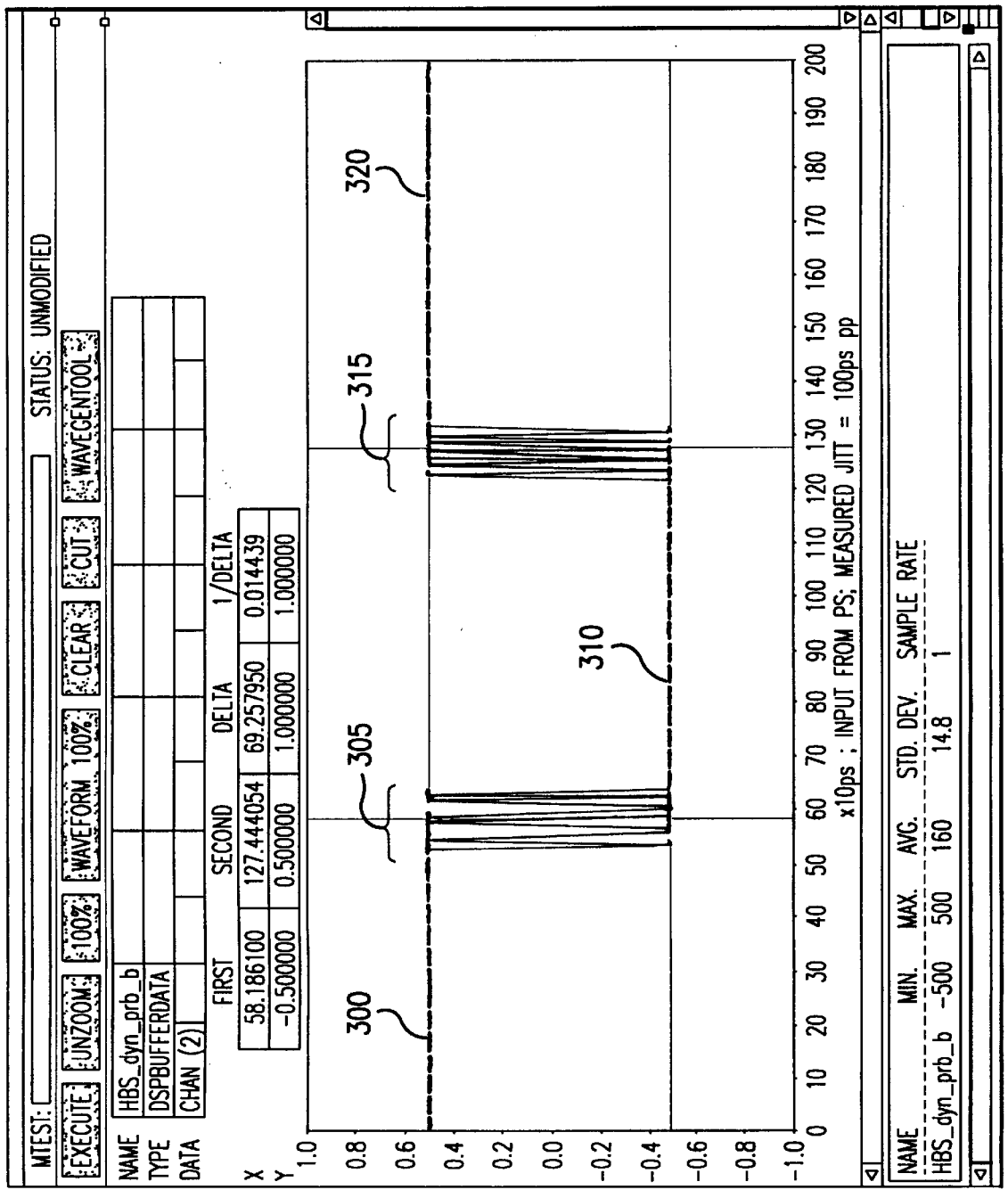
FIG. 3 shows a plot of measurement samples acquired in accordance with the invention.

After acquiring measurement samples, a picture similar to FIG. 3 can be developed for an edge transition. Region 300 and region 320 are in a "high" logic state, while region is in a "low" logic state. Note that the area of edge transition has an overlapping zone where some comparisons revealed an edge above $V_{ref}$ and others below. The transition from "high" to "low" occurs in region 305, the transition from "low" to "high" occurs in region 315. The density of the 1's relative to the 0's in the transition zone is an estimate of the probability of the signal to be greater than $V_{ref}$, that is, in the "high" logic state as follows.

$$P\{x(t)>V_{ref}\}=1/K\Sigma M_j(t)$$

where t=time j=measurement sample number x=signal

K=number of measurements per time step $M_j$=measurement result, $\in$ (0|1)

Figure 4:
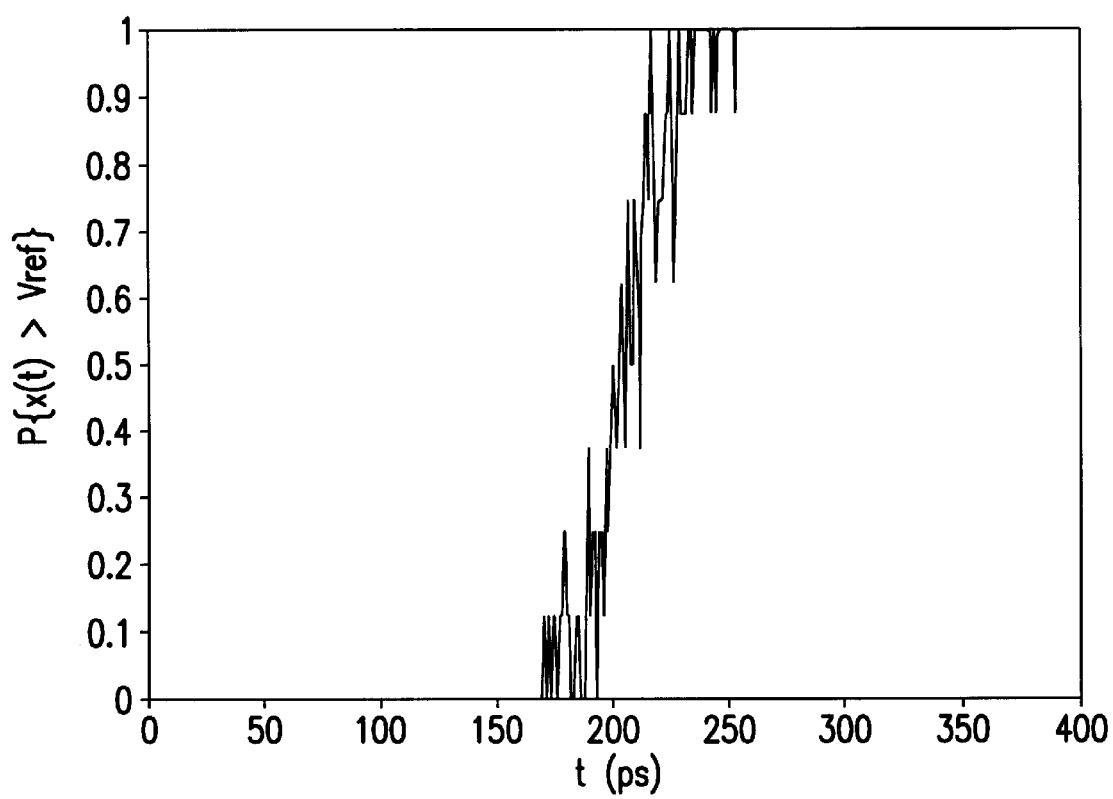
FIG. 4 shows a plot of signal state probability estimate as a function of time prepared in accordance with the invention.

$P\{x(t)>V_{ref}\}$=probability that signal x at time t is greater than reference voltage $V_{ref}$ Using these estimated probabilities of signal edge states, a picture of the edge signal state probability can be constructed; FIG. 4 shows an example of a plot of $P\{x(t)>V_{ref}\}$ vs. time for a signal edge transition.

Figure 5:
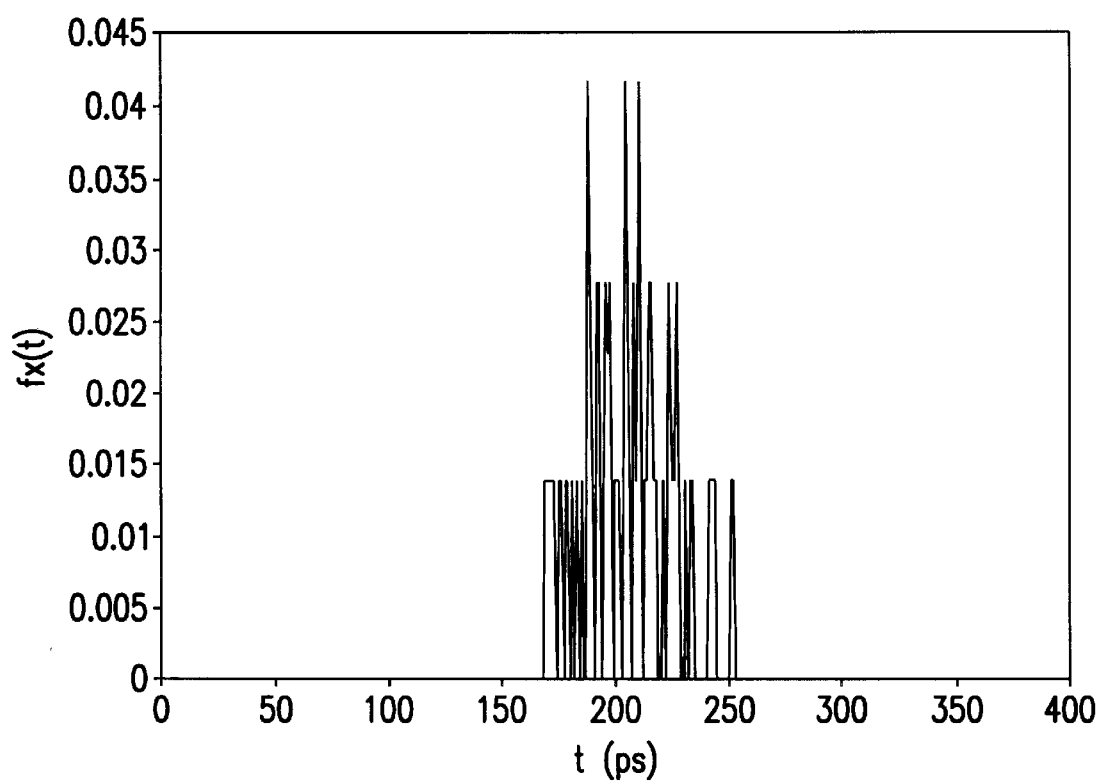
FIG. 5 shows a plot of edge probability density as a function of time prepared in accordane with the invention.

The data representing estimated probabilities of signal edge states are differentiated with respect to time to determine edge probability density $f_x(t)$ as a function of time. FIG. 5 shows an example of a histogram of the signal state transition times, or edge probability density, for the data of FIG. 4.

An example of a signal with a transition edge jitter that is evenly distributed over a time interval would result in $f_x(t)$ of a straight line with height of 1/t stretching across the edge transition zone, t. From the estimate of the edge probability density $f_x(t)$, estimates of the mean and standard deviation of the edge transitions can be determined. The standard deviation gives the rms jitter of the signal. The estimates of the mean and standard deviation using discrete data, $$\mu=1/N\Sigma x$$

and $$\sigma^2=(1/N\Sigma x^2)-\mu^2$$

are derived from the integral definitions, $$\mu=\int x\, f(x)\, dx$$

and $$\sigma^2=(\int x^2 f(x)\, dx)-\mu^2.$$

In the discussion above, the measurements are made with constant density with respect to time. The measurements can also be made with regular time intervals and irregular density. This mode is useful if one has prior knowledge of the where the edge is likely to occur. No useful information is gained by sampling the signal at times when the signal is always at a high or a low logic state. Useful information is only obtained when measurements are made at or near the edge transition. In this case the number of measurement samples K is a function of time I, varying with time rather than a constant for all sampling time points.

Triggering is generated from the system clock, T0, in the ATE, or by a signal synchronous to the repetitive-signal event. This flexibility of choice allows implementation of "self trigger" mode similar to an oscilloscope.

A significant ease-of-use advantage of this comparison-based jitter measurement is that the actual measurement can be done by a small high-speed comparator placed very near to the device under test (DUT). Placing the probe point close the DUT allows one to make high bandwidth measurements without needing to compensate for signal path, impedance matching, and DUT loading effects.

Application Example

Figure 6:
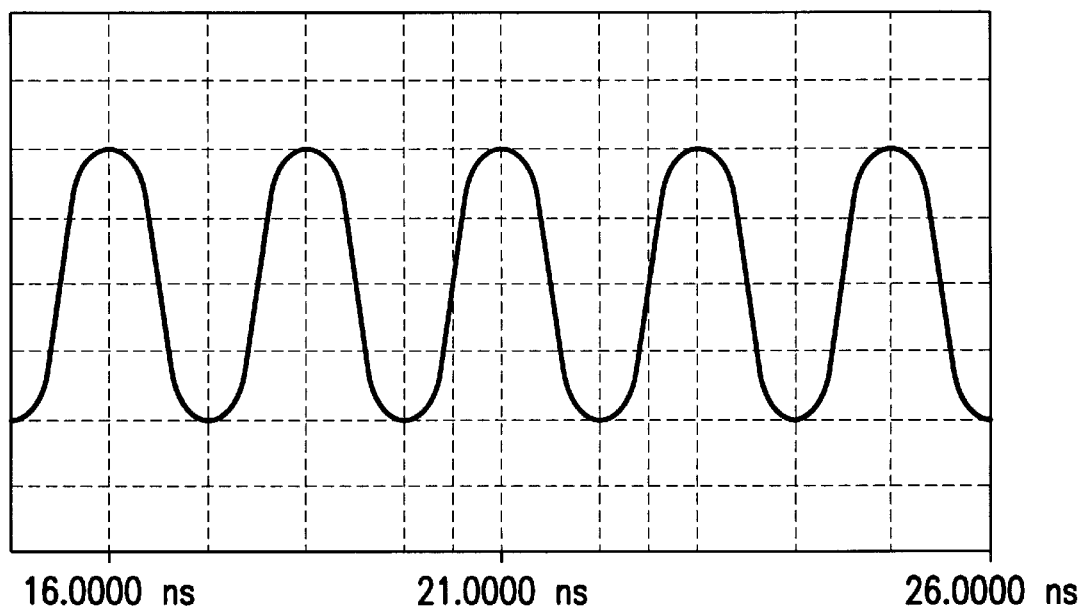
FIG. 6 shows a plot of a 500 MHz clock signal provided by a 1 Gbit data source on which a correlation exercise was performed in accordance with the invention.

A correlation exercise was performed on a 1 Gbps data source, while sourcing a 500 MHz clock (101010..). FIG. 6 shows the 1-Gpbs data source. The oscilloscope (HP54120B) was set to acquire 1000 samples in a 3% voltage compare window out of the full signal swing (800 mV) with self-trigger. The undersampler used was set to a 1 ps effective sampling resolution, and acquired 75 samples across each of the two signal transition edges. The results were correlated with a start/stop time interval measurement instrument (DTS2070) and the oscilloscope histogram measurement. The results of this correlation are given in Table 1. The peak-to-peak jitter of the undersampled comparator measurement is lower than that of the other methods due to the smaller number of samples taken.

TABLE 1

Correlation Results of a 1 Gbit Data Source

| TECHNIQUE | RMS | P—P | EDGE |
|---|---|---|---|
| Start/Stop Time Measurement | 24.0 ps | 126 ps | Rising |
| | 17.0 ps | 112 ps | Falling |
| Oscilloscope | 21.1 ps | 119 ps | Rising |
| | 17.2 ps | 129 ps | Falling |
| Undersampled Comparator | 20.4 ps | 75.0 ps | Rising |
| | 19.9 ps | 80.1 ps | Falling |

TABLE 2

Comparative Analysis of Jitter Measurement Techniques:

| METHOD | ACCURACY | BANDWIDTH | THROUGHPUT | EASE OF USE |
|---|---|---|---|---|
| Spectrum Analyzer | medium | high | low | low |
| Oscilloscope | high | high | low | medium |
| Time Interval Analyzer | low | low | high | medium |
| Start/Stop Time Measurement | high | high | medium | medium |
| Under-sampled Threshold Comparator | high | high | medium | high |

Apparatus

Figure 7:
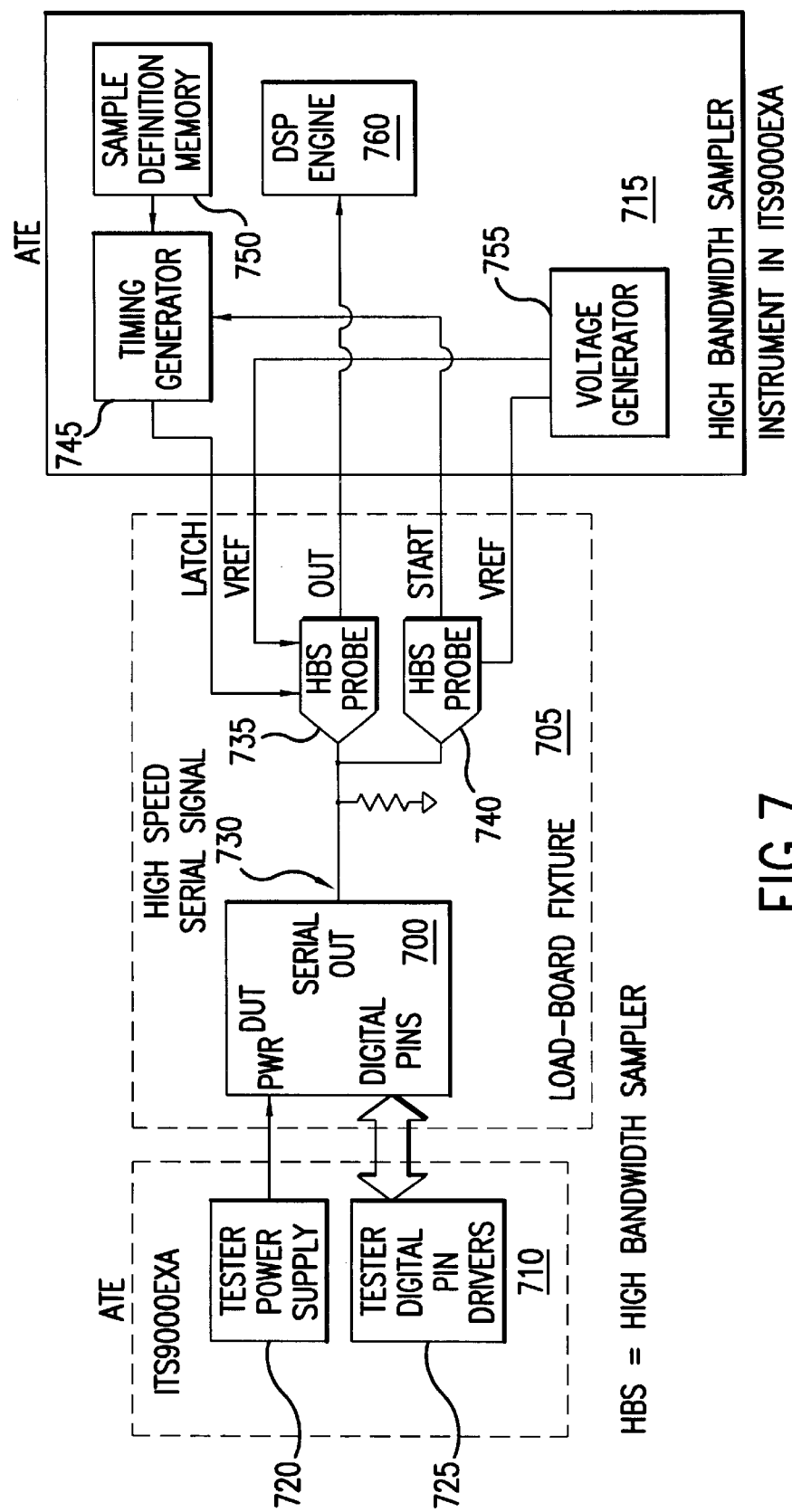
FIG. 7 illustrates apparatus suitable for performing methods in accordance with the invention.

FIG. 7 shows one possible arrangement suitable for performing methods in accordance with the invention. Referring to FIG. 7, a device under test (DUT) 700 is inserted in a device loadboard fixture 705. Device loadboard fixture 705 is attached to an ATE system 710 (such as a Schlumberger ITS9000EXA system available from Schlumberger Technologies, Inc. of San Jose, Calif.) equipped with a sampling instrument 715 (such as a Schlumberger High Bandwidth Sampler). ATE system 710 includes power supplies 720 and digital pin drivers 725 which are connected to the DUT through the loadboard.

These ATE resources (720 and 725) are used to place the DUT in an operative state such that the high speed serial channel signal is active at the serial output line 730 of DUT 700. The high speed serial signal is connected to an appropriate termination and to two high-bandwidth-sampler (HBS) probes 735 and 740, respectively. HBS probe 740 is used to derive a trigger signal for sampling instrument 715. HBS probe 735 is used to compare the DUT signal to the reference signal as described above.

Sampling instrument 715 includes a timing generator 745 which defines the strobe timing locations of the DUT signals. The strobe timing locations can be programmed with flexible density and flexible time positions using data stored in a sample-definition memory 750. A voltage generator 755 in sampling instrument 715 sets the comparator voltage Vref against DUT voltage. For jitter measurements, the level Vref is set for a stable 1voltage around the device switching level. Timing generator 745 is triggered from the tester trigger or the DUT transitions. Sampling instrument 715 includes a digital signal processor (DSP) 760 which processes the captured data and generates the histograms and calculates the mean and standard deviation as described above.

Conclusion

Different methods of jitter measurements were introduced and discussed. A new method applicable to automatic test equipment was introduced and compared to the traditional measurement methods. Although none of the methods described here excel in all aspects, our undersampled-comparator method has shown to be a viable alternative with some particular advantages to the automatic test equipment environment. The undersample-comparator approach discussed above can be applied in traditional mixed signal ATE systems with undersampling capability.

Those of skill in the art will recognize that these and other modifications can be made within the spirit and scope of the invention as defined in the claims.

What is claimed is:

1. A method of measuring jitter of a signal having a repetitive signal pattern, comprising the steps of:
   a. deriving a trigger from the signal;
   b. comparing the signal with a threshold at a plurality of times relative to the trigger during multiple repetitions of the signal pattern to produce measurement samples indicative of signal level relative to the threshold;
   c. determining from the measurement samples the probability of signal edge states as a function of time for the multiple repetitions; and
   d. determining from the probability of signal edge states an edge probability density as a function of time for the multiple repetitions.

2. The method of claim 1, wherein comparing the signal with a threshold comprises comparing level of the signal with a voltage threshold and producing a measurement sample for each comparison.

3. The method of claim 1, wherein the measurement sample is a binary comparison result.

4. The method of claim 1, wherein comparing the signal with a threshold comprises connecting a high-speed comparator to a source of the signal without compensating for signal path.

5. The method of claim 1, wherein comparing the signal with a threshold comprises connecting a high-speed comparator to a source of the signal without compensating for impedance matching.

6. The method of claim 1, wherein comparing the signal with a threshold comprises connecting a high-speed comparator to a source of the signal without compensating for device-under-test (DUT) loading effects.

7. The method of claim 1, wherein comparing the signal with a threshold at a plurality of times during multiple repetitions of the signal pattern is performed relative to a trigger signal.

8. The method of claim 1, wherein comparing the signal with a threshold at a plurality of times during multiple repetitions of the signal pattern is performed relative to a trigger signal generated from a system clock (T0) in an automatic-test-equipment (ATE) tester.

9. The method of claim 1, wherein comparing the signal with a threshold at a plurality of times during multiple repetitions of the signal pattern is performed relative to a trigger signal generated by a signal which is synchronous to the signal having a repetitive signal pattern.

10. The method of claim 1, wherein comparing the signal with a threshold at a plurality of times during multiple repetitions of the signal pattern is performed with incremental time shifts from measurement sample to measurement sample such that resolution of the incremental time shift is the effective sampling rate.

11. The method of claim 1, wherein comparing the signal with a threshold at a plurality of times during multiple repetitions of the signal pattern is performed such that time shift from measurement sample to measurement sample is not linearly incremental.

12. The method of claim 1, wherein comparing the signal with a threshold at a plurality of times during multiple repetitions of the signal pattern is performed such that time shift from measurement sample to measurement sample is linearly incremental.

13. The method of claim 1, wherein comparing the signal with a threshold at a plurality of times during multiple repetitions of the signal pattern is performed such that density of the measurement samples is not constant with respect to time.

14. The method of claim 1, wherein comparing the signal with a threshold at a plurality of times during multiple repetitions of the signal pattern is performed such that density of the measurement samples is constant with respect to time.

15. The method of claim 1, wherein determining the probability of signal edge states comprises estimating probability of signal edge states in accordance with the relationship $P\{x(t)>V_{ref}\}=1/K\Sigma M_j(t)$, where $P\{x(t)>V_{ref}\}$ is the probability over time t that the level of the signal x is greater than a threshold voltage $V_{ref}$, j is the measurement sample number, K is the number of measurement samples per time step, and $M_j$ is a binary measurement sample result.

16. The method of claim 1, wherein determining edge probability density as a function of time comprises differentiating the probability of signal edge states.

17. The method of claim 1, further comprising preparing from the edge probability density as a function of time a histogram of signal state transition times.

18. The method of claim 1, further comprising estimating mean deviation $\mu$ of edge transitions of the signal.

19. The method of claim 1, further comprising estimating standard deviation $\sigma$ of edge transitions of the signal to give the root-mean-square (rms) jitter of the signal.

20. Apparatus for measuring jitter of a signal having a repetitive signal pattern, comprising:
  a. a sample probe (740) for deriving a trigger from the signal;
  b. a sampler (715) having a timing generator (745) and sample probe (735) for comparing the signal with a threshold at a plurality of times relative to the trigger during multiple repetitions of the signal pattern to produce measurement samples indicative of signal level relative to the threshold; and
  c. a processor (760) for determining from the measurement samples the probability of signal edge states as a function of time for the multiple repetitions, and for determining from the probability of signal edge states an edge probability density as a function of time for the multiple repetitions.

* * * * *

UNITED STATES PATENT AND TRADEMARK OFFICE
CERTIFICATE OF CORRECTION

PATENT NO. : 6,661,836 B1
DATED : December 9, 2003
INVENTOR(S) : Wajih Dalal et al.

It is certified that error appears in the above-identified patent and that said Letters Patent is hereby corrected as shown below:

<u>Title page,</u>
Item [73], should read:
-- [73] Assignee: NPTest, LLC, San Jose, CA (US) --

Signed and Sealed this

Sixth Day of April, 2004

JON W. DUDAS
*Acting Director of the United States Patent and Trademark Office*